(12) United States Patent
Yang et al.

(10) Patent No.: US 12,062,702 B2
(45) Date of Patent: Aug. 13, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Mengmeng Yang, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 437 days.

(21) Appl. No.: 17/445,636

(22) Filed: Aug. 23, 2021

(65) Prior Publication Data

US 2022/0208974 A1    Jun. 30, 2022

Related U.S. Application Data

(63) Continuation of application No. PCT/CN2021/100183, filed on Jun. 15, 2021.

(30) Foreign Application Priority Data

Dec. 30, 2020 (CN) .......................... 202011622576.3

(51) Int. Cl.
*H01L 29/40* (2006.01)
*H01L 21/28* (2006.01)
*H01L 29/51* (2006.01)

(52) U.S. Cl.
CPC ...... *H01L 29/401* (2013.01); *H01L 21/28088* (2013.01); *H01L 21/28158* (2013.01); *H01L 29/517* (2013.01)

(58) Field of Classification Search
CPC .......... H01L 29/4966; H01L 21/28088; H01L 21/28158; H01L 21/28185
See application file for complete search history.

(56) References Cited

U.S. PATENT DOCUMENTS

| | | | |
|---|---|---|---|
| 8,853,024 B2 | 10/2014 | Yin | |
| 9,252,229 B2 | 2/2016 | Ando | |
| 9,515,164 B2 | 12/2016 | Ando et al. | |
| 10,395,993 B2 | 8/2019 | Ando et al. | |
| 2011/0227163 A1* | 9/2011 | Wang | H01L 29/517 |
| | | | 257/369 |
| 2012/0280288 A1 | 11/2012 | Ando | |
| 2012/0326245 A1 | 12/2012 | Ando | |
| 2014/0027857 A1 | 1/2014 | Yin | |
| 2015/0255463 A1 | 9/2015 | Ando et al. | |
| 2016/0307805 A1* | 10/2016 | Lai | H01L 21/283 |
| 2017/0025315 A1 | 1/2017 | Ando et al. | |
| 2017/0047330 A1* | 2/2017 | Lai | H01L 21/28088 |
| 2019/0067117 A1* | 2/2019 | Chen | H01L 23/53223 |
| 2019/0318966 A1 | 10/2019 | Ando et al. | |

FOREIGN PATENT DOCUMENTS

| | | |
|---|---|---|
| CN | 101924034 A | 12/2010 |
| IN | 103545180 A | 1/2014 |

* cited by examiner

*Primary Examiner* — Joseph C. Nicely
(74) *Attorney, Agent, or Firm* — Syncoda LLC; Feng Ma (57) ABSTRACT

In a method for manufacturing a semiconductor structure, a substrate is provided; a stack layer is formed on the substrate, the stack layer including an interfacial layer, a high-k dielectric layer and a work function composite layer which are sequentially stacked; a transition layer is formed on the stack layer; and a metal gate layer is formed on the transition layer. The work function composite layer is prepared by a physical vapor deposition process.

14 Claims, 12 Drawing Sheets

METHOD FOR MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2021/100183 filed on Jun. 15, 2021, which claims priority to Chinese Patent Application No. 202011622576.3 filed on Dec. 30, 2020. The disclosures of these applications are hereby incorporated by reference in their entirety.

BACKGROUND

A transistor is an important device in a Dynamic Random Access Memory (DRAM). The performance of the transistor influences the access performance of the DRAM device.

SUMMARY

The disclosure relates generally to the technical field of manufacturing semiconductors, and more specifically to a method for manufacturing a semiconductor structure, and a semiconductor structure.

In a first aspect, some embodiments of the present disclosure provide a method for manufacturing a semiconductor structure, including the following operations.

A substrate is provided, the substrate including an active area, and the active area including a source region, a drain region, and a channel region.

A stack layer is formed on the substrate, the stack layer including an interfacial layer, a high-k dielectric layer, and a work function composite layer which are sequentially stacked.

A transition layer is formed on the stack layer.

A metal gate layer is formed on the transition layer.

The work function composite layer is prepared by a physical vapor deposition process.

In a second aspect, some embodiments of the present disclosure provide a semiconductor structure, including: a substrate, an interfacial layer, a high-k dielectric layer, a transition layer, and a metal gate layer.

The substrate includes a semiconductor layer, the semiconductor layer includes a source region and a drain region, and a channel region is formed between the source region and the drain region.

The interfacial layer is formed on the substrate.

The high-k dielectric layer is formed on the interfacial layer. Work function adjusting particles are gathered at an interface between the interfacial layer and the high-k dielectric layer.

The transition layer is formed on the high-k dielectric layer.

The metal gate layer is formed on the transition layer.

BRIEF DESCRIPTION OF THE DRAWINGS

In order to describe the technical solutions in the example of the present disclosure or in the conventional art more clearly, a simple introduction on the accompanying drawings which are needed in the description of the example or conventional art is given below. Apparently, the accompanying drawings in the description below are some examples of the disclosure. Other drawings may be obtained by those of ordinary skill in the art without any creative effort according to the drawings.

Reference numerals are illustrated as follows.

10—substrate; 11—source region; 12—drain region; 13—channel region; 20—interfacial layer; 30—high-k dielectric layer; 40—work function composite layer; 41—first barrier layer; 42—work function layer; 43—second barrier layer; 50—transition layer; 60—metal gate layer; 80—additional layer; 81—sidewall; 82—metal silicon compound layer; and 83—strained silicon layer.

DETAILED DESCRIPTION

With the continuous miniaturization of the size of the transistor, a High-k and Metal Gate (HKMG) technology has become a common preparation method of a transistor device with a feature size below 45 nm, which can improve the switching speed of the transistor and reduce a gate leakage current, thereby optimizing the access performance of the DRAM device. A transistor structure of the HKMG includes a substrate, a silicon oxide layer, a high-k dielectric layer, a work function adjusting layer and a metal gate which are sequentially stacked. The work function adjusting layer is a composite layer of a $La_xO_y$ ($Al_xO_y$) layer and a TiN layer. The TiN layer is generally made by a physical vapor deposition (PVD) process, and the $La_xO_y$ ($Al_xO_y$) layer is generally made by an atomic layer deposition (ALD) process to control the thickness of the $La_xO_y$ ($Al_xO_y$) layer.

However, a manufacturing procedure in which PVD and ALD are performed by different station apparatuses can easily cause oxidization of the TiN layer of the work function adjusting layer, which makes it more difficult for Al or La to diffuse into the dielectric layer, and meanwhile, also causes an increase in an interlayer resistance value, and affects the performance of the transistor, thereby influencing the access performance of the DRAM device.

Various embodiments of the present disclosure provide a transistor structure of the current High-k and Metal Gate (HKMG) including a substrate, a silicon oxide layer, a high-k dielectric layer, a work function adjusting layer and a metal gate which are sequentially stacked. The work function adjusting layer is a composite layer of a $La_xO_y$ ($Al_xO_y$) layer and a TiN layer. The TiN layer is generally made by a physical vapor deposition (PVD) process, and the $La_xO_y$ ($Al_xO_y$) layer is generally made by an atomic layer deposition (ALD) process to control the thickness of the $La_xO_y$ ($Al_xO_y$) layer. However, a manufacturing procedure in different station apparatuses of current PVD and ALD is liable to cause an oxygen atom in the $La_xO_y$ ($Al_xO_y$) layer prepared by the ALD to be liable to diffuse into the TiN layer, thereby causing the formation of oxide TiO in the TiN layer, and making the diffusion of Al or La into the dielectric layer more difficult. Moreover, in a preparation method of the ALD, the TiN layer is also liable to be influenced by the oxygen atom, so that a resistance value of the TiN layer is increased, the performance of the transistor formed in the semiconductor structure is influenced, and the access performance of a Dynamic Random Access Memory (DRAM) device is influenced.

Therefore, according to the method for manufacturing the semiconductor structure and the semiconductor structure provided by the example of the present disclosure, the stack layer is formed on the substrate, and the work function between the interfacial layer and the high-k dielectric layer is adjusted by utilizing the work function composite layer of the stack layer, so that the change of the work function of the interfacial layer is ensured, a turn-on structure of an electron or hole is conveniently formed in the channel region, and the performance of the semiconductor structure is optimized. Through formation of the high-k dielectric layer of the stack layer, the quantum tunneling effect between the substrate and the metal gate may be reduced, so that the problem of a metal gate leakage current is reduced. Through arrangement of the transition layer, the arrangement difficulty of the metal gate layer may be reduced. Through arrangement of the metal gate layer, the performance of a gate structure may be optimized. Through utilization of the physical vapor deposition process to prepare the work function composite layer, the problem that a part of material of the work function composite layer is liable to be oxidized may be reduced, so that the interlayer resistance value of the semiconductor structure is effectively reduced, and the performance of the manufactured semiconductor structure is improved.

In order to make the objects, technical solutions, and advantages of the present disclosure clearer, the technical solutions in the examples of the present disclosure will be described below in more details with reference to the accompanying drawings in the preferred examples of the present disclosure. In the drawings, the same or similar reference numerals refer to the same or similar components or the components having the same or similar functions throughout. The described examples are some, but not all the examples of the present disclosure. The examples described below by reference to the drawings are exemplary, are intended to explain the present disclosure, and should not be construed as a limitation to the present disclosure. On the basis of the examples in the present disclosure, all other examples obtained by those skilled in the art without any creative effort fall within the protection scope of the present disclosure. The examples of the present disclosure will be described below in detail with reference to the accompanying drawings.

Figure 1:
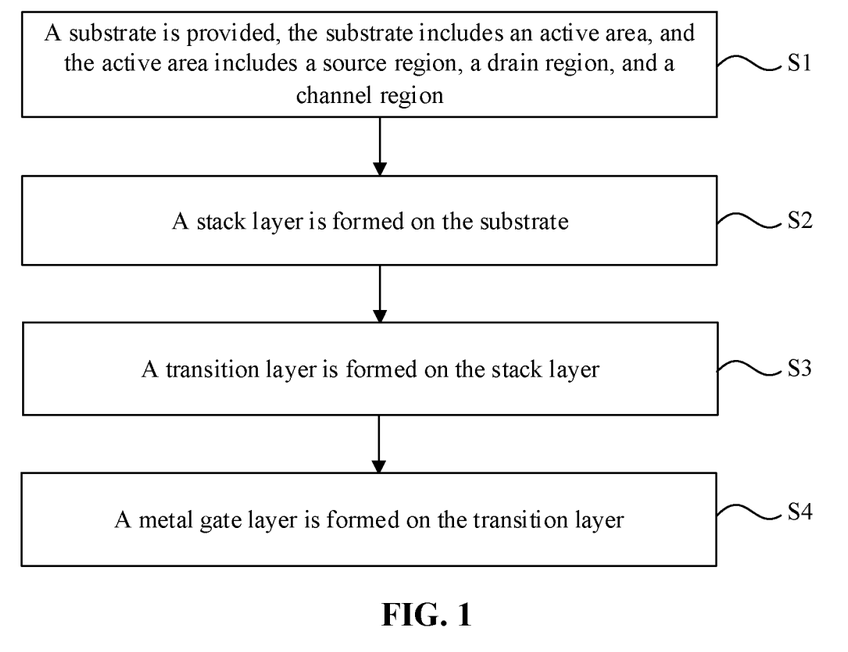
FIG. 1 is a flow chart of a method for manufacturing a semiconductor structure provided by an example of the present disclosure.
Figure 2:
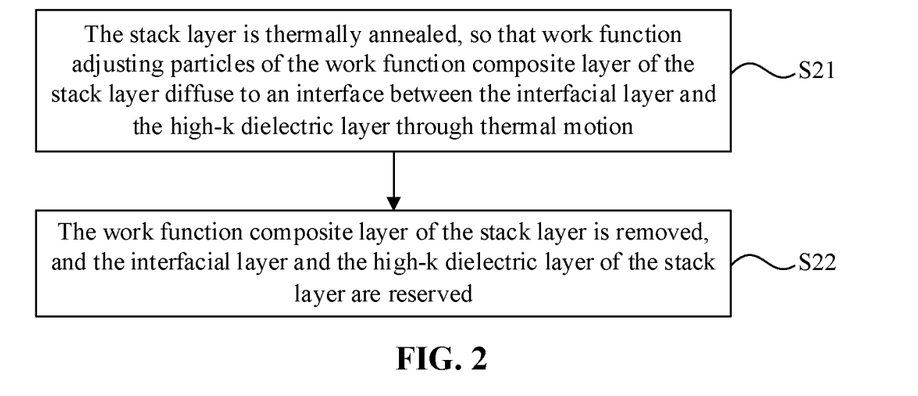
FIG. 2 is a flow chart of a work function adjusting procedure of a method for manufacturing a semiconductor structure provided by an example of the present disclosure.
Figure 3:
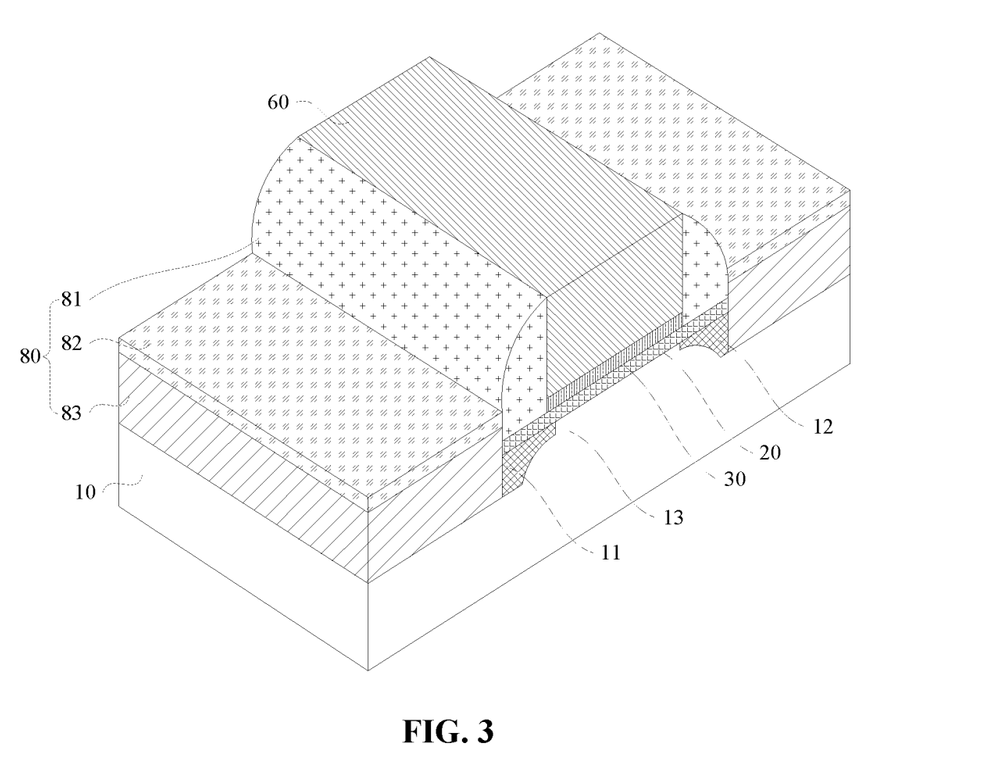
FIG. 3 is a structural schematic diagram of a semiconductor structure provided by an example of the present disclosure.
Figure 4:
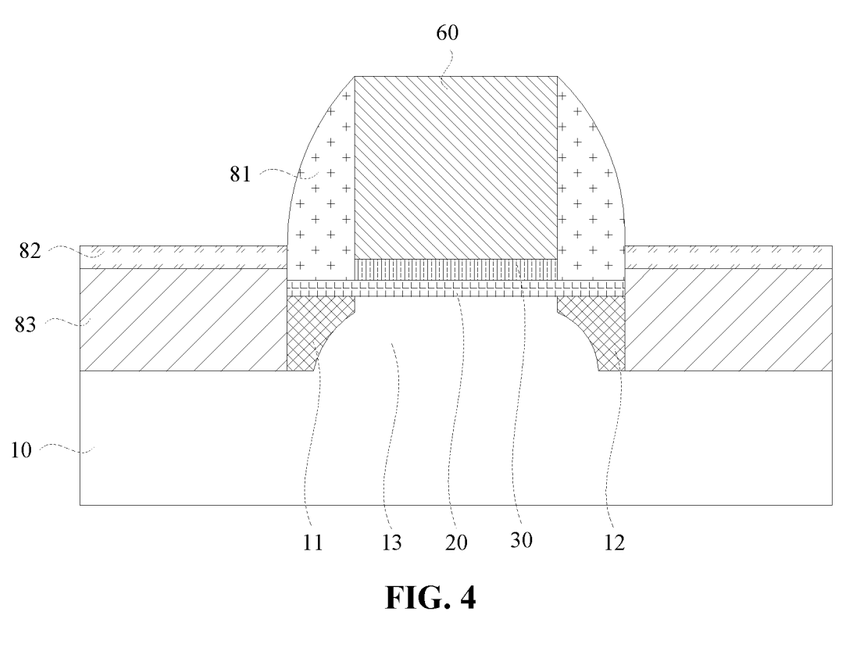
FIG. 4 is a front view of a semiconductor structure provided by an example of the present disclosure.
Figure 5:
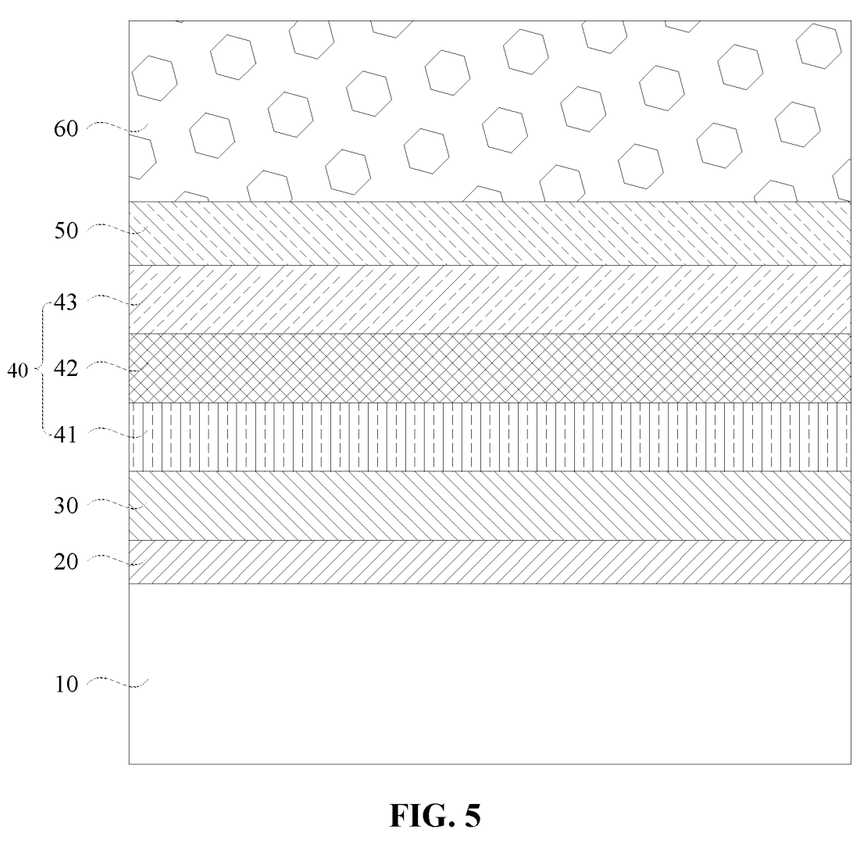
FIG. 5 is a structural schematic diagram of a part of a semiconductor structure provided by an example of the present disclosure.
Figure 6:
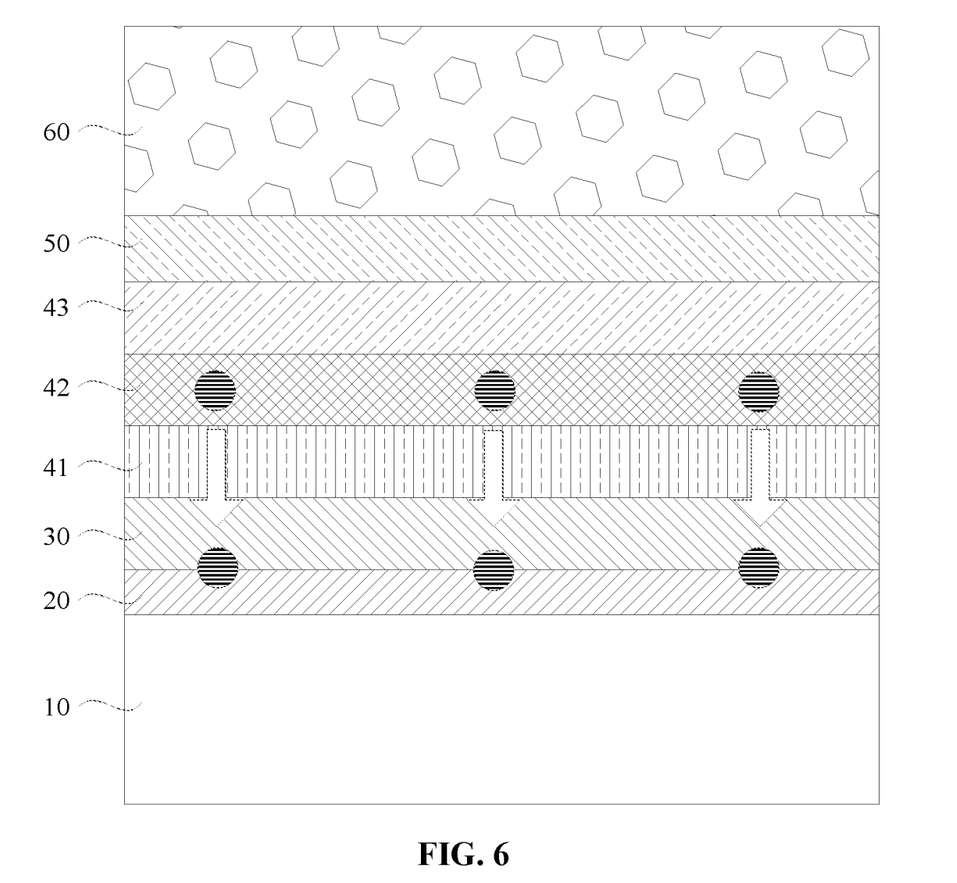
FIG. 6 is a structural schematic diagram of a first work function adjusting particles diffusion of a semiconductor structure provided by an example of the present disclosure.
Figure 7:
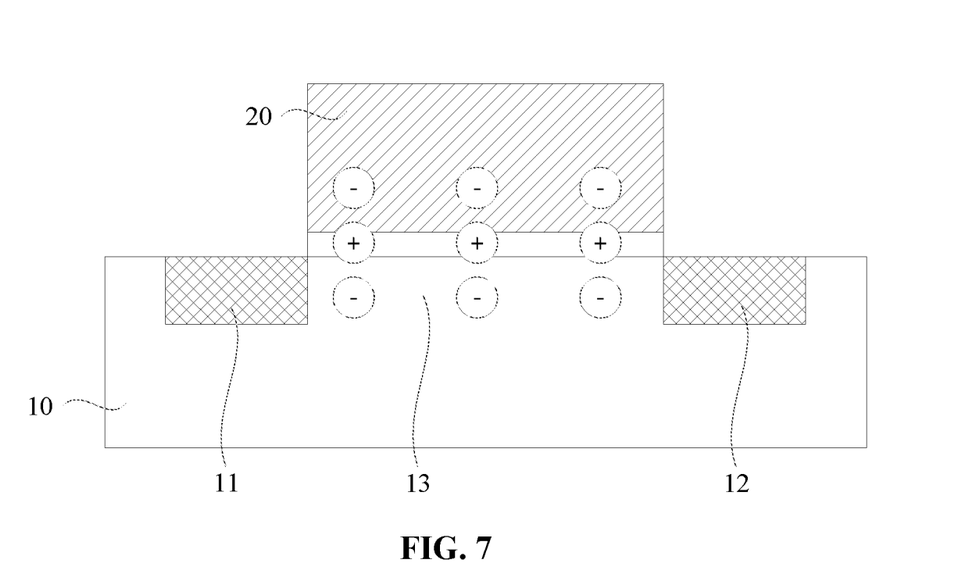
FIG. 7 is a structural schematic diagram of the first work function adjusting particles adjusting channel region of a semiconductor structure provided by an example of the present disclosure.
Figure 8:
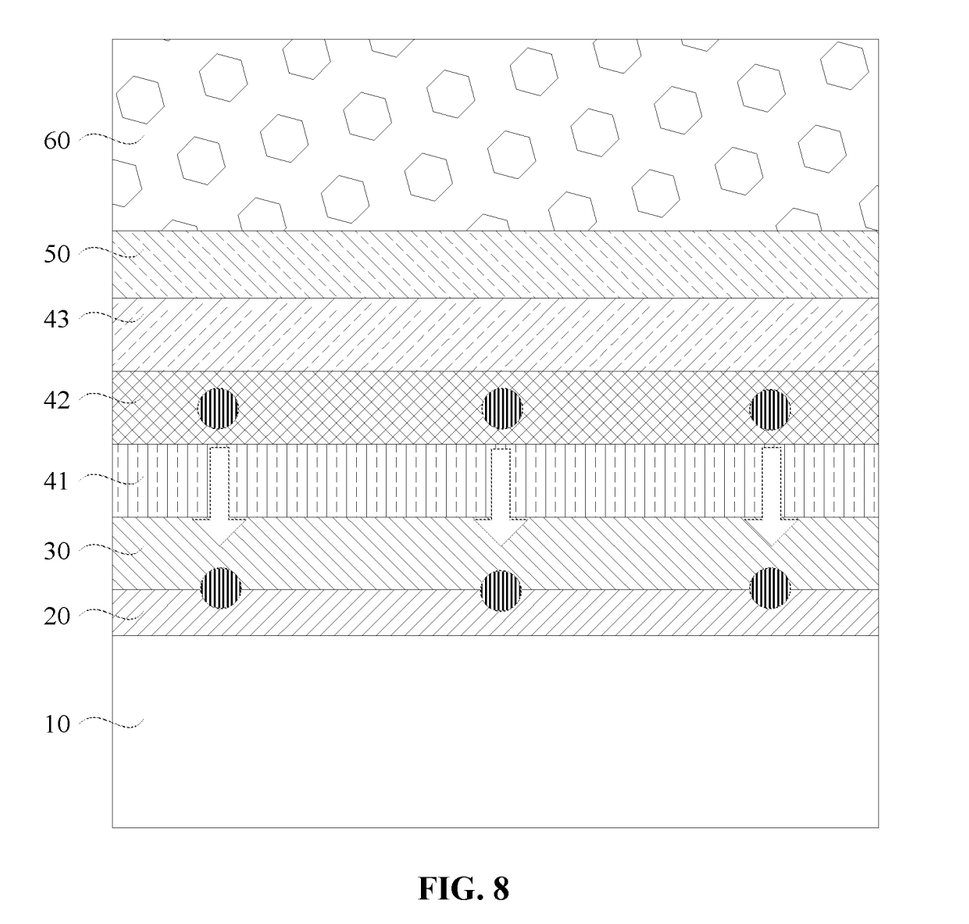
FIG. 8 is a structural schematic diagram of a second work function adjusting particles diffusion of a semiconductor structure provided by an example of the present disclosure.
Figure 9:
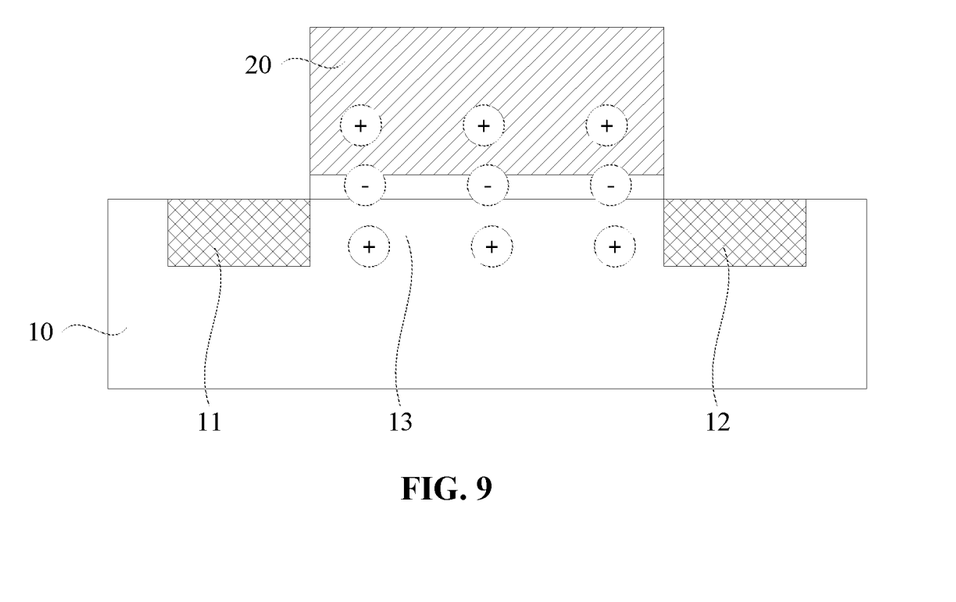
FIG. 9 is a structural schematic diagram of the second work function adjusting particles adjusting channel region of a semiconductor structure provided by an example of the present disclosure.
Figure 10:
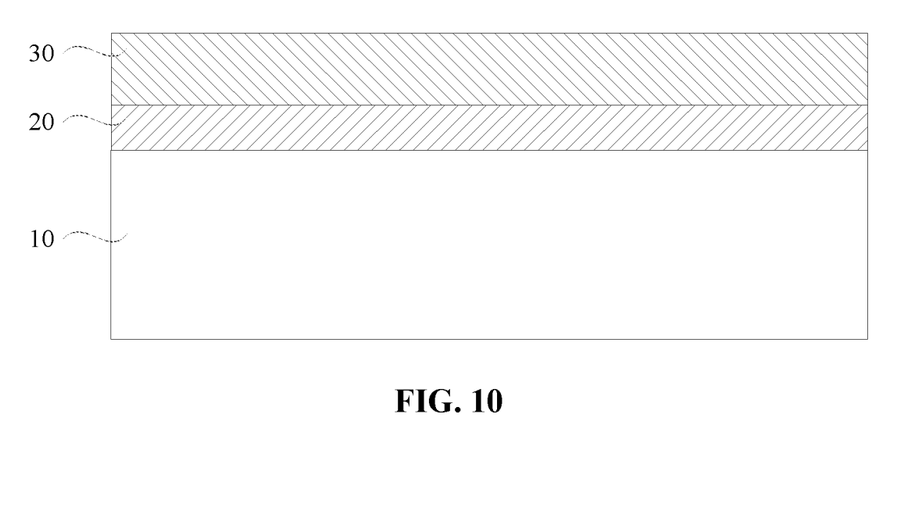
FIG. 10 is a structural schematic diagram of a substrate, an interfacial layer, and a high-k dielectric layer of a semiconductor structure provided by an example of the present disclosure.
Figure 11:
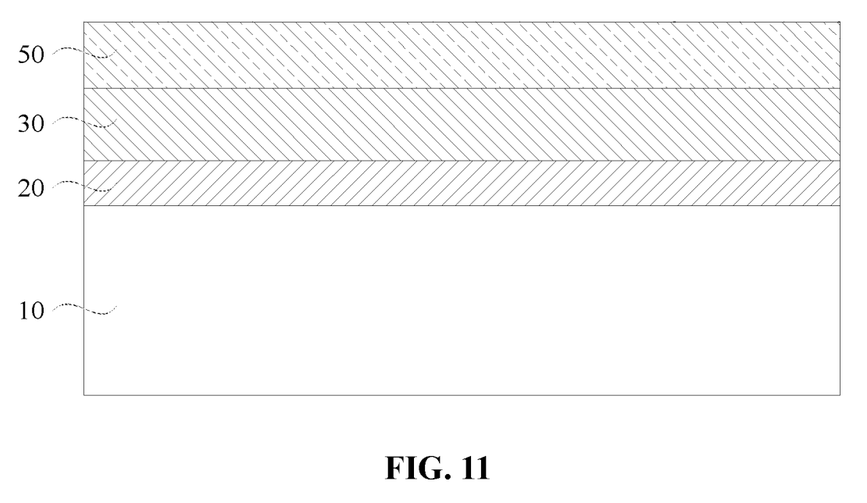
FIG. 11 is a structural schematic diagram of a substrate, an interfacial layer, a high-k dielectric layer, and a transition layer of a semiconductor structure provided by an example of the present disclosure.
Figure 12:
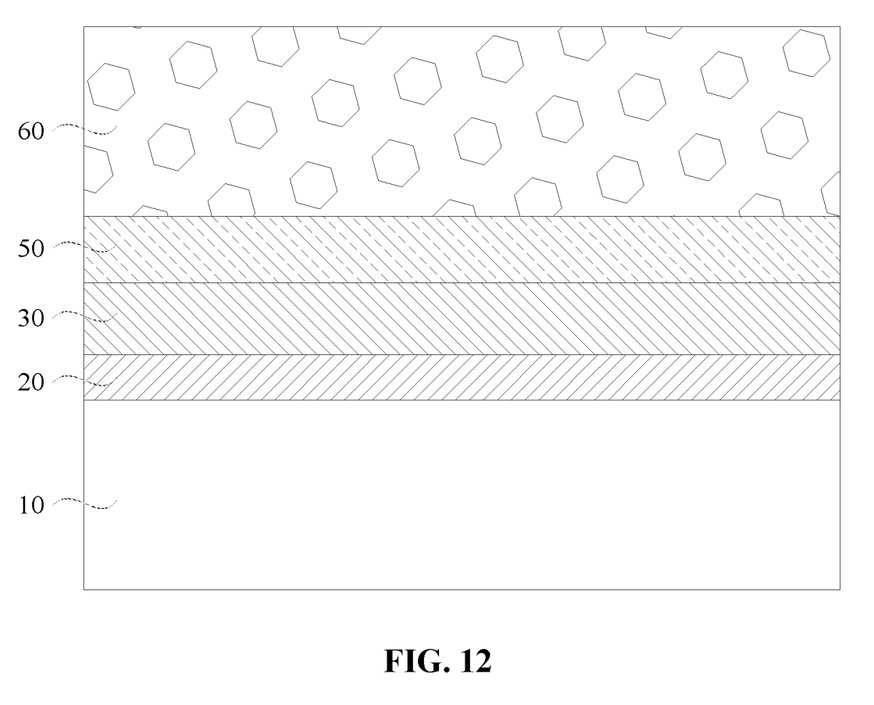
FIG. 12 is a structural schematic diagram of a substrate, an interfacial layer, a high-k dielectric layer, a transition layer, and a metal gate layer of a semiconductor structure provided by an example of the present disclosure.

FIG. 1 is a flow chart of a method for manufacturing a semiconductor structure provided by an example of the present disclosure. FIG. 2 is a flow charge of a work function adjusting procedure of a method for manufacturing a semiconductor structure provided by an example of the present disclosure. FIG. 3 is a structural schematic diagram of a semiconductor structure provided by an example of the present disclosure. FIG. 4 is a front view of a semiconductor structure provided by an example of the present disclosure. FIG. 5 is a structural schematic diagram of a part of a semiconductor structure provided by an example of the present disclosure. FIG. 6 is a structural schematic diagram of a first work function adjusting particles diffusion of a semiconductor structure provided by an example of the present disclosure. FIG. 7 is a structural schematic diagram of the first work function adjusting particles adjusting channel region of a semiconductor structure provided by an example of the present disclosure. FIG. 8 is a structural schematic diagram of a second work function adjusting particles diffusion of a semiconductor structure provided by an example of the present disclosure. FIG. 9 is a structural schematic diagram of the second work function adjusting particles adjusting channel region of a semiconductor structure provided by an example of the present disclosure. FIG. 10 is a structural schematic diagram of a substrate, an interfacial layer, and a high-k dielectric layer of a semiconductor structure provided by an example of the present disclosure. FIG. 11 is a structural schematic diagram of a substrate, an interfacial layer, a high-k dielectric layer, and a transition layer of a semiconductor structure provided by an example of the present disclosure. FIG. 12 is a structural schematic diagram of a substrate, an interfacial layer, a high-k dielectric layer, a transition layer, and a metal gate layer of a semiconductor structure provided by an example of the present disclosure.

Referring to FIG. 1 and FIG. 2, as well as combining with FIG. 3 to FIG. 12, the example of the present disclosure provides a method for manufacturing a semiconductor structure, including the following operations.

S1: a substrate is provided, the substrate including an active area, and the active area including a source region, a drain region, and a channel region.

It is to be noted that the material of the substrate 10 may be monocrystalline silicon, polycrystalline silicon, amorphous silicon, a silicon germanium compound, or silicon-on-insulator (SOI) or the like or other material known to those skilled in the art. The substrate 10 may provide a support basis for a structural layer on the substrate 10. In the example, the substrate 10 is a Si substrate. The substrate 10 may have a semiconductor layer. The semiconductor layer forms an active area of the substrate 10. The active area includes a source region 11 and a drain region 12, and a channel region 13 is formed between the source region 11 and the drain region 12.

S2: a stack layer is formed on the substrate. The stack layer includes an interfacial layer 20, a high-k dielectric layer 30, and a work function composite layer 40 which are sequentially stacked.

It is to be noted that the interfacial layer 20 of the stack layer is located on the substrate 10, the high-k dielectric layer 30 is located at one side of the interfacial layer 20 away from the substrate 10, and the work function composite layer 40 is located at other side of the high-k dielectric layer 30 away from the interfacial layer 20. The interfacial layer 20 may be a $SiO_2$ layer, a $Si/SiO_2$ interface is formed between the substrate 10 and the interfacial layer 20, the stability of the $Si/SiO_2$ interface is higher, and the stable arrangement of a subsequent structure layer may be ensured.

Moreover, on the basis of the continuous reduction of the feature size of a current semiconductor, in order to improve the subsequent short channel effect, and the quantum tunneling effect between the substrate 10 and a gate structure, the high-k dielectric layer 30 is used as a gate dielectric layer. The high-k dielectric layer 30 may effectively reduce the quantum tunneling effect between the substrate 10 and a gate, and reduce a problem of a gate leakage current and the problem of relatively high power consumption due to the gate leakage current.

Further, in the transistor formed in the semiconductor structure, the channel region 13 of the transistor may form a turn-on structure, and the work function composite layer 40 may adjust a work function of the interfacial layer 20 in the semiconductor structure, thereby reducing the difficulty of forming the turn-on structure in the channel region 13 and increasing the switching speed of the transistor formed in the semiconductor structure.

S3: a transition layer is formed on the stack layer.

It is to be noted that the transition layer 50 may be further arranged on the stack layer. The transition layer 50 may facilitate the subsequent arrangement of a metal gate layer 60 and the reduction of the arrangement difficulty of the metal gate layer 60. The stability of a contact interface between the metal gate layer 60 and the transition layer 50 is relatively high. The structure may be shown in FIG. 11.

S4: a metal gate layer is formed on the transition layer. The structure may be shown in FIG. 12.

It is to be noted that compared to a conventional gate of polycrystalline silicon material, the metal gate layer 60 of the example replaces the gate of polycrystalline silicon to solve problems (for example, threshold drift, polycrystalline silicon gate depletion effect, excessive gate resistance, Fermi level pinning, and the like), thereby optimizing the stability and performance of the semiconductor structure.

As an implementable example, the material of the metal gate layer 60 includes aluminum or tungsten, through such arrangement, the preparation difficulty of the metal gate layer 60 may be reduced, and the performance of the metal gate layer 60 and the semiconductor structure may be optimized.

It is to be specifically noted that in the example, the work function composite layer 40 is prepared by a physical vapor deposition process. On the basis of the physical vapor deposition process, in a vacuum preparation environment, to-be-coated material is gasified and deposited on a surface of a base body in a mode of evaporating or sputtering, and the like, so that compared to an atomic layer deposition process adopted in the related art, through utilization of the vacuum environment in the physical vapor deposition process, the oxidation of the material of the partial layer in the semiconductor structure may be avoided, and the interlayer resistance value of the semiconductor structure is prevented from being increased by the generated oxide.

Specifically, referring to FIG. 5, the work function composite layer 40 includes a first barrier layer 41, a work function layer 42 and a second barrier layer 43 which are sequentially stacked.

The first barrier layer 41 is located at one side of the work function layer 42 close to the high-k dielectric layer 30.

The second barrier layer 43 is located at other side of the work function layer 42 away from the high-k dielectric layer 30.

It is to be noted that through utilization of the first barrier layer 41, the work function layer 42 is prevented from direct contact with the high-k dielectric layer 30, and through utilization of the second barrier layer 43, the work function layer 42 is prevented from direct contact with the transition layer 50, thereby reducing the influence of an adjacent layer structure on the work function layer 42 and ensuring the structure stability of the work function layer 42.

Moreover, the first barrier layer 41 and the second barrier layer 43 may prevent metal material of other structure layers (mainly the subsequently formed metal gate layer 60) in the semiconductor structure from penetrating and diffusing into the substrate 10 to influence the formation of a turn-on structure in the substrate 10 and turn-on and turn-off procedures of the turn-on structure, thereby improving the stability of the transistor structure formed in the semiconductor structure.

As an implementable example, the first barrier layer 41 is a titanium nitride layer or a tantalum nitride layer. The second barrier layer 43 is a titanium nitride layer or a tantalum nitride layer. On the basis that the first barrier layer 41 and the second barrier layer 43 are respectively attached to different surfaces of the work function layer 42, a forming procedure of the work function layer 42 may influence the structure of the first barrier layer 41 and the second barrier layer 43, and on the basis that the first barrier layer 41 is prepared before the work function layer 42 is formed, the influence on the first barrier layer 41 is particularly apparent. If the work function layer 42 is prepared in a non-vacuum environment, or oxygen presents in the work function layer 42, the first barrier layer 41 and the second barrier layer 43 are caused to oxidize and generate an oxide, and the interlayer resistance value of the first barrier layer 41 and the second barrier layer 43 is caused to increase. Therefore, through utilization of the physical vapor deposition process in the example, the presence of a large amount of oxygen may be effectively avoided in the preparation procedure of the work function layer 42 and the oxidation of the first barrier layer 41 and the second barrier layer 43 is avoided.

On the basis that in a subsequent work function adjusting procedure, the work function adjusting particles need to pass through the first barrier layer 41 from the work function layer 42 to the interface between the interfacial layer 20 and the high-k dielectric layer 30 through thermal diffusion motion, a low resistance value of the first barrier layer 41 in the example facilitates the diffusion of the work function adjusting particles and avoids the influence on the work function adjusting procedure.

Specifically, after the step that a stack layer is formed on the substrate and before the step that a transition layer is formed on the stack layer, that is, after S2 and before S3, the following operations are further included.

S21: the stack layer is thermally annealed to diffuse work function adjusting particles in the work function composite layer of the stack layer to an interface between the interfacial layer and the high-k dielectric layer through thermal motion.

The work function adjusting particles are located in the work function layer 42.

S22: the work function composite layer of the stack layer is removed, and the interfacial layer and the high-k dielectric layer of the stack layer are reserved.

It is to be noted that the thermal annealing procedure may cause the work function adjusting particles in the work function composite layer 40 to diffuse to the interface between the interfacial layer 20 and the high-k dielectric layer 30 through the thermal diffusion motion. In the semiconductor structure adjusted through the work function, a change in the work function of the interfacial layer 20 facilitates the formation of the turn-on structure in the channel region 13 of the substrate 10.

As an implementable example, a material of the high-k dielectric layer 30 includes hafnium silicate, and a material of the interfacial layer 20 includes silicon oxide, and a hafnium silicate/silicon oxide interface is formed between the substrate 10 and the interfacial layer 20.

The temperature of the thermal annealing is in a range from 700° C. to 1100° C., and the thermal annealing is performed for a time period from 5 s to 3 h. According to a process parameter of the above thermal annealing, the work function adjusting particles are ensured to have sufficient thermal budget so as to diffuse to the interface between the interfacial layer 20 and the high-k dielectric layer 30. When the thermal annealing temperature is too low or the thermal annealing time is too short, the thermal budget in the thermal diffusion motion of the work function adjusting particles may be too small, the thermal diffusion motion cannot be completed, or the work function adjusting particles cannot diffuse to a predetermined location, thereby influencing a work function adjusting result. When the thermal annealing temperature is too high or the thermal annealing time is too long, more energy may loss in the preparation procedure of the semiconductor structure, the preparation cost is improved, and a high-temperature environment may influence other layer structures in the semiconductor structure, thereby reducing the stability of the semiconductor structure. Therefore, in practical use, a user may adjust the temperature and time of the thermal annealing in the above range as required, and the example does not limit specific values of the temperature and time.

The work function adjusting particles include aluminum ions, or the work function adjusting particles include lanthanum ions. In practical use, the user may adjust the type of the work function adjusting particles according to the type of the transistor formed in the semiconductor structure so as to achieve the purpose of improving the performance of the semiconductor structure, and the example does not limit this.

Further, on the basis that the work function adjustment is completed, the work function composite layer 40 may be removed to facilitate the subsequent formation of the metal gate layer 60 on the transition layer 50. Therefore, the transition layer 50 in the example is formed on the high-k dielectric layer 30 of the stack layer.

In the example, the work function adjusting procedure mainly includes the following two procedures.

As an implementable example, referring to FIG. 6 and FIG. 7, a doping type of the substrate 10 is N-type, and a doping type of the source region 11, the drain region 12 and the channel region 13 is P-type. The work function layer 42 is a metal aluminum layer.

It is to be noted that the work function adjusting particles are aluminum ions in the metal aluminum layer, the aluminum ions diffuse to the interface between the interfacial layer 20 and the high-k dielectric layer 30, and the work function of the interfacial layer 20 adjacent to the interface may be increased, thereby improving the ability of the interfacial layer 20 to attract an electron. When a gate of the transistor is in a turn-on state in a subsequent semiconductor structure, the electrons are enriched in the interfacial layer 20, and the excessive electrons in the substrate 10 are repelled, so that the channel region 13 of the substrate 10 close to the interfacial layer 20 forms the turn-on structure of a hole.

It is to be noted that compared to the aluminum oxide layer used in the work function layer 42 in the related art, the metal aluminum layer used in the example may effectively reduce the content of oxygen in the work function layer 42, thereby preventing the first barrier layer 41 and oxygen in the aluminum oxide layer from reacting in the high-temperature environment to form the oxide during the thermal annealing, and reducing a resistance value of the work function adjusting particles diffusing to a predetermined location. Illustrated in FIG. 6 is a schematic procedure of aluminum ions diffusion.

As an implementable example, referring to FIG. 8 and FIG. 9, a doping type of the substrate 10 is P-type, and a doping type of the source region 11, drain region 12 and channel region 13 is N-type. The work function layer 42 is a metal lanthanum layer.

It is to be noted that the work function adjusting particles are lanthanum ions in the metal lanthanum layer, the lanthanum ions diffuse to the interface between the interfacial layer 20 and the high-k dielectric layer 30, and the work function of the interfacial layer 20 adjacent to the interface may be reduced, thereby improving the ability of the interfacial layer 20 to attract the hole. When the gate of the transistor is in the turn-on state in the subsequent semiconductor structure, the holes are enriched in the interfacial layer 20, and the excessive holes in the substrate 10 are repelled, so that the channel region 13 of the substrate 10 close to the interfacial layer 20 forms the turn-on structure of the electron.

It is to be noted that, similar to the above metal aluminum layer, compared to the lanthanum oxide layer used in the work function layer 42 in the related art, the metal aluminum layer used in the example may effectively reduce the content of oxygen in the work function layer 42, thereby preventing the first barrier layer 41 and oxygen in the lanthanum oxide layer from reacting in the high-temperature environment to form the oxide during the thermal annealing, and reducing a resistance value of the work function adjusting particles diffusing to a predetermined location. Illustrated in FIG. 8 is a schematic procedure of lanthanum ions diffusion.

The thickness of the work function layer 42 is in a range from 3 Å to 7 Å. On the basis that the work function layer 42 is pure metal material, the content of the work function adjusting particles is richer, so that the thickness of the work function layer 42 may be appropriately reduced. In the related art, if the aluminum oxide layer or the lanthanum oxide layer is used, the thickness thereof is generally 10 Å to 15 Å. Therefore, an arrangement mode of the example reduces the thickness of the work function layer 42, not only the preparation difficulty of the work function layer 42 may be reduced, but also the overall thickness of the semiconductor structure may be reduced.

The thickness of the first barrier layer 41 is in a range from 30 Å to 90 Å. It is to be noted that, on the basis of the possibility that the first barrier layer 41 is oxidized, the possibility that the first barrier layer 41 is oxidized may be reduced through appropriate adjustment of the thickness thereof, thereby reducing the resistance value thereof and optimizing the performance of the semiconductor structure.

As an implementable example, a material of the high-k dielectric layer 30 includes one or more selected from magnesium oxide, aluminum oxide, calcium oxide, yttrium oxide, hafnium silicate, hafnium oxide, zirconium oxide, tantalum oxide, lanthanum oxide, barium oxide, strontium oxide and zirconium silicate. Through such arrangement, the richness of the material of the high-k dielectric layer 30 may be ensured, and the preparation difficulty of the high-k dielectric layer 30 is reduced. In practical use, a user may select the above material as required to prepare the high-k dielectric layer 30, and the example does not limit the specific material.

The material of the transition layer 50 includes polycrystalline silicon. Through such arrangement, the metal gate layer 60 may be conveniently formed on the transition layer 50, the connection stability of the metal gate layer 60 and the transition layer 50 is improved, and the interlayer performance of the metal gate layer 60 and the transition layer 50 is optimized.

On the basis of the above method for manufacturing the semiconductor structure, the example of the present disclosure further provides a semiconductor structure, including: a substrate 10, an interfacial layer 20, a high-k dielectric layer 30, a transition layer 50 and a metal gate layer 60.

The substrate 10 includes an active area, the active area includes a source region 11 and a drain region 12, and a channel region 13 is formed between the source region 11 and the drain region 12.

The interfacial layer 20 is formed on the substrate 10.

The high-k dielectric layer 30 is formed on the interfacial layer 20. Work function adjusting particles are gathered at an interface between the interfacial layer 20 and the high-k dielectric layer 30.

The transition layer 50 is formed on the high-k dielectric layer 30.

The metal gate layer 60 is formed on the transition layer 50.

It is to be noted that the semiconductor structure of the example may be a DRAM device, and that the above substrate 10, interfacial layer 20, high-k dielectric layer 30, transition layer 50 and metal gate layer 60 are part of layer structures in the DRAM device and may form a transistor structure in the DRAM device. In addition, the transistor structure may further include an additional layer 80, for example, a sidewall 81 arranged at a sidewall of the metal gate layer 60, a strained silicon layer 83 located at the substrate 10, and a metal silicon compound layer 82 located on strained silicon layer 83. The sidewall 81 may protect the structure stability of the metal gate layer 60. The strained silicon layer 83 is located at the substrate 10 and on both sides of the active region respectively, to strain the channel region 13 and improve carrier mobility. The metal silicon compound layer 82 is located above the strained silicon layer 83 to prevent the strained silicon layer 83 from reacting with other layer structures on the metal silicon compound layer 82, thereby ensuring the structure stability of the strained silicon layer 83.

The interfacial layer 20 is arranged on the substrate 10, and the interfacial layer 20 is a structure layer adjusted through a work function. The work function adjustment particles diffuse to an interface between the interfacial layer 20 and the high-k dielectric layer 30. The interfacial layer 20 adjusted through the work function facilitates the formation of the channel region 13 in a turn-on state between the source region 11 and the drain region 12 of the substrate 10. Through adjustment of the magnitude of a threshold voltage, the switching speed of the transistor formed in the semiconductor structure is increased.

The high-k dielectric layer 30 reduces the quantum tunneling effect of a gate dielectric layer, thereby reducing a gate leakage current of the transistor formed in the semiconductor structure and the problem of high power consumption caused thereby. Moreover, the metal gate layer 60 of the metal material is stacked on the high-k dielectric layer 30 to generate smaller equivalent oxidation thickness. Meanwhile, through the metal gate layer 60, phenomena (for example, threshold voltage drift, polycrystalline silicon gate depletion effect, excessive gate resistance, Fermi level pinning, and the like) of a polycrystalline silicon gate may be reduced, therefore, through the above arrangement, the stability of the semiconductor structure may be improved, and the performance of the transistor formed in the semiconductor structure is improved.

Further, the DRAM device may further include an array of multiple storage units formed on the substrate 10, and each of the storage units includes a capacitor and the above transistor. The capacitor is configured to store data, and the transistor may control access of the capacitor to the data, the metal gate layer 60 of the transistor is connected with a word line, the drain region 12 is connected with a bit line, and the source region 11 is connected with the capacitor. A voltage signal on the word line can control the transistor to be turned on and off. Further, data information stored in the capacitor is read through the bit line, or the data information is written, through the bit line, into the capacitor for storage. The data access of the DRAM device is implemented, therefore when the above transistor of the example is applied to the DRAM device, the access performance of the DRAM device may be improved.

In the description, it will be appreciated that unless expressly specified and limited otherwise, the terms "mounted", "linked", and "connected" are to be interpreted broadly, for example, may be fixed connection, may also be indirect connection through an intermediary, and may be communication between two elements, or interaction between two elements. The specific meaning of the above terms in the present disclosure may be understood by those of ordinary skill in the art according to specific situations. The terms "upper", "lower", "front", "rear", "vertical", "horizontal", "top", "bottom", "inner", "outer", or the like refer to orientations or location relationships on the basis of the orientations or the location relationships shown in the drawings, are merely intended to facilitate the description of the present disclosure and to simplify the description, and are not intended to indicate or imply that a device or element referred to must have a specific orientation or be configured and operated in a specific orientation, so that the terms should not be construed as a limitation to the present disclosure. In the description of the present disclosure, "a plurality of" means two or more unless specifically stated otherwise.

The terms "first", "second", "third", "fourth", and the like (if any) in the specification and claims of the present disclosure and in the above drawings are used to distinguish similar targets and unnecessarily to describe a specific sequence or sequential order. It will be appreciated that such data may be interchangeable where appropriate, so that the examples of the present disclosure described herein can be, for example, implemented in a sequence except for those illustrated or described herein. In addition, the terms "include" and "having", as well as any variations thereof, are intended to cover a non-exclusive inclusion, for example, a process, a method, a system, a product, or an apparatus that includes a series of steps or elements is not necessarily limited to those expressly listed steps or elements, but may include other steps or elements not expressly listed or inherent to such process, method, product, or apparatus.

Finally, it is to be noted that: the above examples are merely used to describe the technical solutions of the present disclosure and are not intended to limit the present disclosure. Although the present disclosure has been described in detail with reference to the foregoing examples, those skilled in the art will appreciate that: the technical solutions of the above examples may still be modified, or some or all of the technical features thereof may be equivalently replaced, and through these modifications and replacements, the nature of the corresponding technical solutions do not depart from the scope of the technical solutions of the examples of the present disclosure.

What is claimed is:

1. A method for manufacturing a semiconductor structure, comprising:
    providing a substrate, the substrate comprising an active area, and the active area comprising a source region, a drain region, and a channel region;
    forming a stack layer on the substrate, the stack layer comprising an interfacial layer, a high-k dielectric layer, and a work function composite layer which are sequentially stacked;
    forming a transition layer on the stack layer; and
    forming a metal gate layer on the transition layer,
    wherein the work function composite layer is prepared by a physical vapor deposition process, and the work function composite layer comprises a first barrier layer, a work function layer, and a second barrier layer which are sequentially stacked, the first barrier layer being located at one side of the work function layer close to the high-k dielectric layer, and the second barrier layer being located at other side of the work function layer away from the high-k dielectric layer.

2. The method for manufacturing method the semiconductor structure of claim 1, wherein a doping type of the substrate is N-type, and a doping type of the source region, the drain region and the channel region is P-type, and
    the work function layer is an aluminum layer.

3. The method for manufacturing the semiconductor structure of claim 1, wherein a doping type of the substrate is P-type, and a doping type of the source region, the drain region and the channel region is N-type, and
    the work function layer is a lanthanum layer.

4. The method for manufacturing the semiconductor structure of claim 1, wherein the first barrier layer is a titanium nitride layer or a tantalum nitride layer, and/or
    the second barrier layer is a titanium nitride layer or a tantalum nitride layer.

5. The method for manufacturing the semiconductor structure of claim 1, after said forming a stack layer on the substrate and before said forming a transition layer on the stack layer, further comprising:
    performing a thermal annealing process on the stack layer to diffuse work function adjusting particles in the work function composite layer of the stack layer to an interface between the interfacial layer and the high-k dielectric layer through thermal motion, wherein the work function adjusting particles are located in the work function layer; and
    removing the work function composite layer of the stack layer, and reserving the interfacial layer and the high-k dielectric layer of the stack layer.

6. The method for manufacturing method the semiconductor structure of claim 5, wherein the work function adjusting particles comprise aluminum ions, or
    the work function adjusting particles comprise lanthanum ions.

7. The method for manufacturing the semiconductor structure of claim 5, wherein in said preforming the thermal annealing process on the stack layer to diffuse work function adjusting particles in the work function composite layer of the stack layer to an interface between the interfacial layer and the high-k dielectric layer through thermal motion,
    a temperature of the thermal annealing is in a range from 700° C. to 1100° C.; and
    the thermal annealing is performed for a time period from 5 s to 3 h.

8. The method for manufacturing the semiconductor structure of claim 1, wherein a thickness of the work function layer is in a range from 3 Å to 7 Å.

9. The method for manufacturing the semiconductor structure of claim 1, wherein a thickness of the first barrier layer is in a range from 30 Å to 90 Å.

10. The method for manufacturing the semiconductor structure of claim 1, wherein a material of the high-k dielectric layer comprises hafnium silicate and a material of the interfacial layer comprises silicon oxide, and a hafnium silicate/silicon oxide interface is formed between the substrate and the interfacial layer.

11. The method for manufacturing the semiconductor structure of claim 1, wherein a material of the high-k dielectric layer comprises one or more selected from magnesium oxide, aluminum oxide, calcium oxide, yttrium oxide, hafnium silicate, hafnium oxide, zirconium oxide, tantalum oxide, lanthanum oxide, barium oxide, strontium oxide and zirconium silicate.

12. The method for manufacturing the semiconductor structure of claim 1, wherein a material of the metal gate layer comprises aluminum or tungsten.

13. A method for manufacturing a semiconductor structure, comprising:
    providing a substrate, the substrate comprising an active area, and the active area comprising a source region, a drain region, and a channel region;
    forming a stack layer on the substrate, the stack layer comprising an interfacial layer, a high-k dielectric layer, and a work function composite layer which are sequentially stacked;
    forming a transition layer on the stack layer; and
    forming a metal gate layer on the transition layer,
    wherein the work function composite layer is prepared by a physical vapor deposition process; and
    wherein a material of the transition layer comprises polycrystalline silicon.

14. A semiconductor structure, comprising:
    a substrate, the substrate comprising an active area, the active area comprising a source region and a drain region, and a channel region being formed between the source region and the drain region;
    an interfacial layer, the interfacial layer being formed on the substrate;
    a high-k dielectric layer, the high-k dielectric layer being formed on the interfacial layer; wherein work function adjusting particles are gathered at an interface between the interfacial layer and the high-k dielectric layer and diffused from a work function composite layer stacked on the high-k dielectric layer, the work function composite layer is prepared by a physical vapor deposition process, and the work function composite layer comprises a first barrier layer, a work function layer, and a second barrier layer which are sequentially stacked, the first barrier layer being located at one side of the work function layer close to the high-k dielectric layer, and the second barrier layer being located at other side of the work function layer away from the high-k dielectric layer;

a transition layer, the transition layer being formed on the high-k dielectric layer; and a metal gate layer, the metal gate layer being formed on the transition layer.

* * * * *